(12) United States Patent
Hwang et al.

(10) Patent No.: US 6,653,727 B2
(45) Date of Patent: Nov. 25, 2003

(54) SEMICONDUCTOR CHIP PACKAGE WITH DIRECTION-FLEXIBLE MOUNTABILITY

(75) Inventors: Yi-Sung Hwang, Chungcheongnam-do (KR); Sang-Woo Kim, Chungcheongnam-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/293,532

(22) Filed: Nov. 12, 2002

(65) Prior Publication Data

US 2003/0197263 A1 Oct. 23, 2003

(30) Foreign Application Priority Data

Apr. 17, 2002 (KR) ........................................ 2002-20931

(51) Int. Cl.<sup>7</sup> ............................................... H01L 23/48
(52) U.S. Cl. ...................................... 257/693; 257/697
(58) Field of Search ............................... 257/693, 697, 257/691, 694, 695, 696

(56) References Cited

U.S. PATENT DOCUMENTS

| 5,126,822 | A | * | 6/1992 | Salters et al. |
| 5,165,067 | A | * | 11/1992 | Wakefield et al. |
| 5,512,783 | A | * | 4/1996 | Wakefield |
| 6,288,924 | B1 | * | 9/2001 | Sugano et al. |
| 6,540,845 | B1 | * | 1/2002 | Oda |
| 6,501,173 | B2 | * | 12/2002 | Nishizawa et al. |

FOREIGN PATENT DOCUMENTS

| JP | 59-222953 | | 2/1984 |
| JP | 1-107138 | | 7/1989 |
| JP | 4-111294 | * | 4/1992 |
| JP | 07-297353 | | 11/1995 |
| JP | 9-293938 | * | 11/1997 |

OTHER PUBLICATIONS

English language abstract for Japanese publication No. 1–107138.
English language abstract for Japanese publication No. 07–297353.
English language abstract for Japanese publication No. 59–222953.

* cited by examiner

Primary Examiner—Sheila V. Clark
(74) Attorney, Agent, or Firm—Marger Johnson & McCollom, P.C.

(57) ABSTRACT

A semiconductor chip package with direction-flexible mountability comprising a switching circuit for switching a pin function according to the mounting direction of a package, a pair of pin-definition pins for defining the pin function and a pair of power supply leads, and a pair of ground leads. One of the power supply lead pair and the ground lead pair is rotation-symmetrical to the other, respectively. The semiconductor chip package with direction-flexible mountability in accordance with the present invention eliminates a process for indicating the mounting direction because the package can be mounted onto a substrate regardless the direction. Accordingly, the ID pin indication and a series of processes for testing the ID pin are eliminated and the malfunction due to the incorrect direction is prevented.

20 Claims, 12 Drawing Sheets

FIG. 5

| No | PD1: H<br>PD2: L | PD1: L<br>PD2: H | No | PD1: H<br>PD2: L | PD1: L<br>PD2: H |
|---|---|---|---|---|---|
| 1 | H | L | 12 | L | H |
| 2 | A6 | /WE | 13 | /WE | A6 |
| 3 | A5 | I/O4 | 14 | I/O4 | A5 |
| 4 | A4 | I/O3 | 15 | I/O3 | A4 |
| 5 | A3 | I/O2 | 16 | I/O2 | A3 |
| 6 | A0 | I/O1 | 17 | I/O1 | A0 |
| 7 | A1 | A9 | 18 | A9 | A1 |
| 8 | A2 | A8 | 19 | A8 | A2 |
| 9 | /CS | A7 | 20 | A7 | /CS |
| 10 | GND | | 21 | GND | |
| 11 | Vcc | | 22 | Vcc | |

FIG. 9

| 1  | H   | 12 | L    |
|----|-----|----|------|
| 2  | A6  | 13 | /WE  |
| 3  | A5  | 14 | I/O4 |
| 4  | A4  | 15 | I/O3 |
| 5  | A3  | 16 | I/O2 |
| 6  | A0  | 17 | I/O1 |
| 7  | A1  | 18 | A9   |
| 8  | A2  | 19 | A8   |
| 9  | /CS | 20 | A7   |
| 10 | GND | 21 | NC   |
| 11 | Vcc | 22 | NC   |

FIG. 11

| 1  | L    | 12 | H   |
|----|------|----|-----|
| 2  | /WE  | 13 | A6  |
| 3  | I/O4 | 14 | A5  |
| 4  | I/O3 | 15 | A4  |
| 5  | I/O2 | 16 | A3  |
| 6  | I/O1 | 17 | A0  |
| 7  | A9   | 18 | A1  |
| 8  | A8   | 19 | A2  |
| 9  | A7   | 20 | /CS |
| 10 | NC   | 21 | GND |
| 11 | NC   | 22 | Vcc |

SEMICONDUCTOR CHIP PACKAGE WITH DIRECTION-FLEXIBLE MOUNTABILITY

This application relies for priority upon Korean Patent Application No. 2002-20931, filed on Apr. 17, 2002, the contents of which are herein incorporated by reference in their entirety.

TECHNICAL FIELD OF THE INVENTION

The present invention relates to semiconductor devices and, in particular, to a semiconductor chip package with direction-flexible mountability which can always operate normally regardless of the mounting direction when the semiconductor chip package is mounted onto a substrate.

BACKGROUND OF THE INVENTION

In general, a semiconductor chip package comprises a package body made of epoxy molding resin and a plurality of leads protruding from the package body for external connection. The semiconductor chip package can be classified according to the configuration of the leads, for example, SIP (Single Inline Package), DIP (Dual Inline Package) and QFP (Quad Flat Package). The leads are arranged along opposing sides or all four sides of the package. The conventional semiconductor chip package is described below.

FIG. 1 illustrates a pin configuration of a conventional semiconductor chip package. FIG. 2 is a schematic logic diagram of the semiconductor chip package shown in FIG. 1. FIG. 3 is a functional block diagram of the semiconductor chip package shown in FIG. 1.

Referring to FIGS. 1 to 3, the conventional semiconductor chip package 130 is an eighteen-pin memory device in which leads 150 for external connection are aligned in the direction of the longer sides of a rectangular package body 140. Each lead 150 is specified by a pin number that has an inherent function. The first to seventh leads are address pins numbered in order A6, A5, A4, A3, A0, A1 and A2, respectively. An eighth lead is a chip. select pin (/CS). A ninth lead is a ground pin (GND). A tenth lead is a write enable pin (/WE). The eleventh to fourteenth leads are input/output pins (I/04 to I/01), respectively. The fifteenth to seventeenth leads are also address pins (A9 to A7), respectively. And, an eighteenth lead is a power supply pin (VCC). The ground pin (GND) is rotation-symmetrical to the power supply pin (VCC). The semiconductor chip package 130 further has an index pin 145 (hereinafter referred to as an ID pin) on the package body 140 so as to indicate the first lead.

The conventional semiconductor chip package must be aligned in the direction in which the semiconductor chip package is mounted onto a substrate. Because each lead has a fixed function, the circuit of the substrate should be consistent with the pin function and the semiconductor chip package should be mounted onto the substrate in a predetermined direction for a normal operation. If the circuit of the substrate is inconsistent with the mounting direction of the package, the semiconductor chip package does not operate normally. The basis of direction is the power supply pin (VCC) and the ground pin (GND). For correct alignment, the package body 140 has the ID pin 145 so that the user can easily recognize the first lead.

Therefore, the conventional semiconductor chip package has some disadvantages due to the limitation of direction. First, it requires an index marking process for indicating the mounting direction of the package or the position of the first lead. It also requires a test process including a visual inspection for guaranteeing correct placement of the index mark. Second, it requires continuous attention to the correct lead position and watchfulness throughout the package assembly process. Third, even if the proper direction is completely assured, the conventional method further requires guarantees of correct pin configuration in the substrate fabrication process. Additionally, it requires guarantees of the proper mounting direction during handling and transportation of materials for inventory management, along with the resultant extra human resources involved in such operations.

SUMMARY OF THE INVENTION

Accordingly, an object of the present invention is to provide a semiconductor chip package which can operate normally regardless of the mounting direction of a package upon a substrate.

Another object of the present invention is to provide a semiconductor chip package which eliminates the index process for indicating an ID pin.

In order to achieve the foregoing and other objects, the present invention provides a semiconductor chip package comprising a switching circuit for switching a pin function according to the mounting direction of the package, a pair of pin definition leads for defining the pin function, a pair of power supply leads, and a pair of ground leads.

It is preferred that the pin definition leads are aligned with the power supply leads, and that the power supply leads are disposed at the outermost edge of a row of leads. One of the power supply lead pair, the ground lead and the pin definition lead, is rotation-symmetrical to the other. That is, as the mounting direction of the package rotates by 90 or 180 degrees, one of these lead pairs may correspond to the other.

The semiconductor chip package in accordance with the present invention may be DIP (Dual Inline Package), QFP (Quad Flat Package), BGA (Ball Grid Array) or SIP (Single Inline Package). It is preferred that the semiconductor chip package of the present invention is applied to memory devices having address pins, input/output pins, control pins, power supply pins and ground pins.

BRIEF DESCRIPTION OF THE DRAWINGS

These and other objects, features and advantages of the present invention will be readily understood with reference to the following detailed description thereof provided in conjunction with the accompanying drawings, wherein like reference numerals designate like structural elements throughout, and, in which:

FIG. 5 is a table showing a pin function of the semiconductor chip package shown in FIG. 4;

FIG. 9 is a table showing the pin function when the semiconductor chip package shown in FIG. 4 is mounted in normal direction;

FIG. 11 is a table showing the pin function when the semiconductor chip package shown in FIG. 4 is mounted in opposite direction.

DETAILED DESCRIPTION OF THE PREFERRED EMBODIMENTS

Preferred embodiments of the present invention will be described below with reference to the accompanying drawings.

Figure 1:
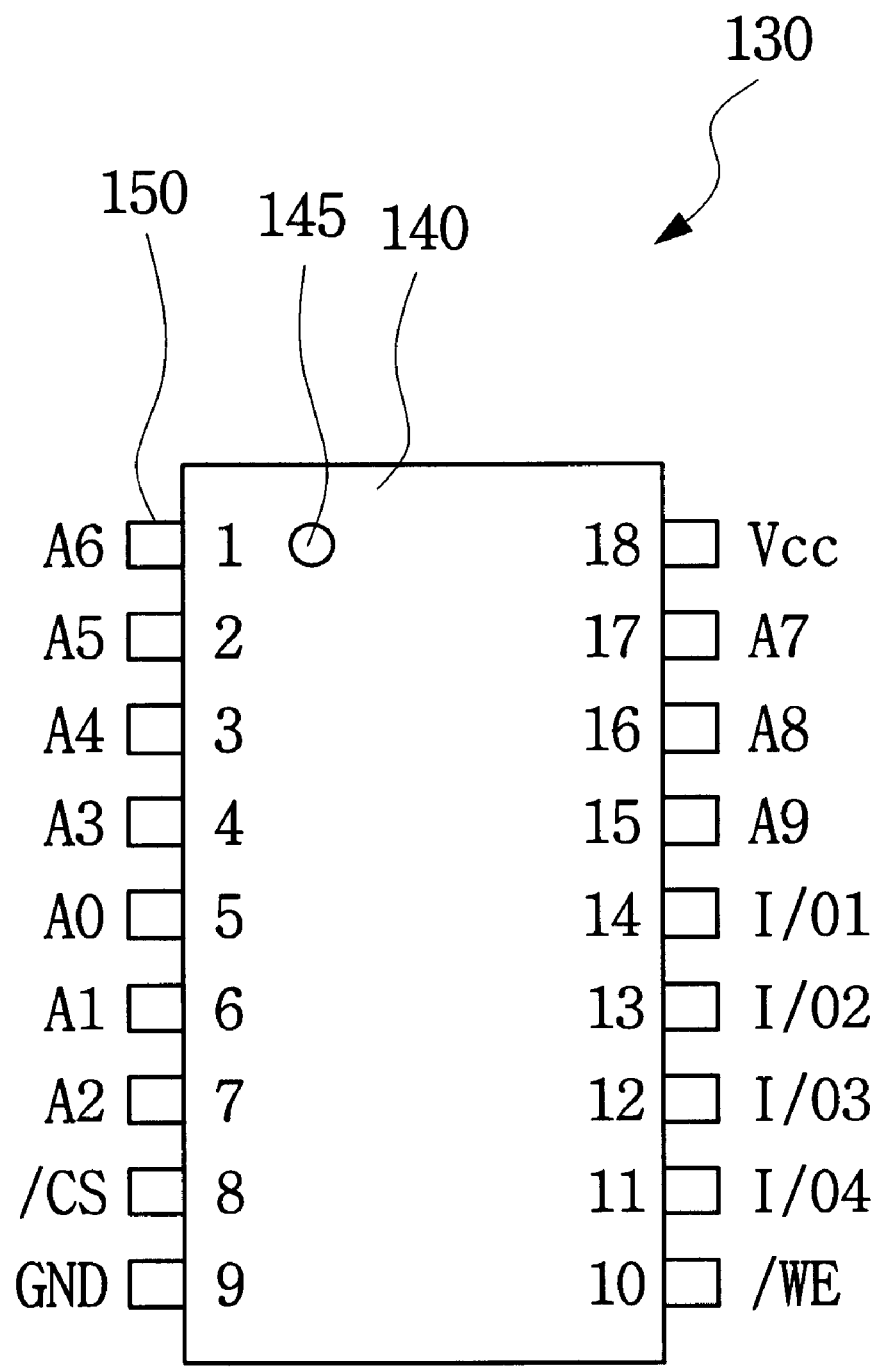
FIG. 1 illustrates a pin configuration of a conventional semiconductor chip package.
Figure 2:
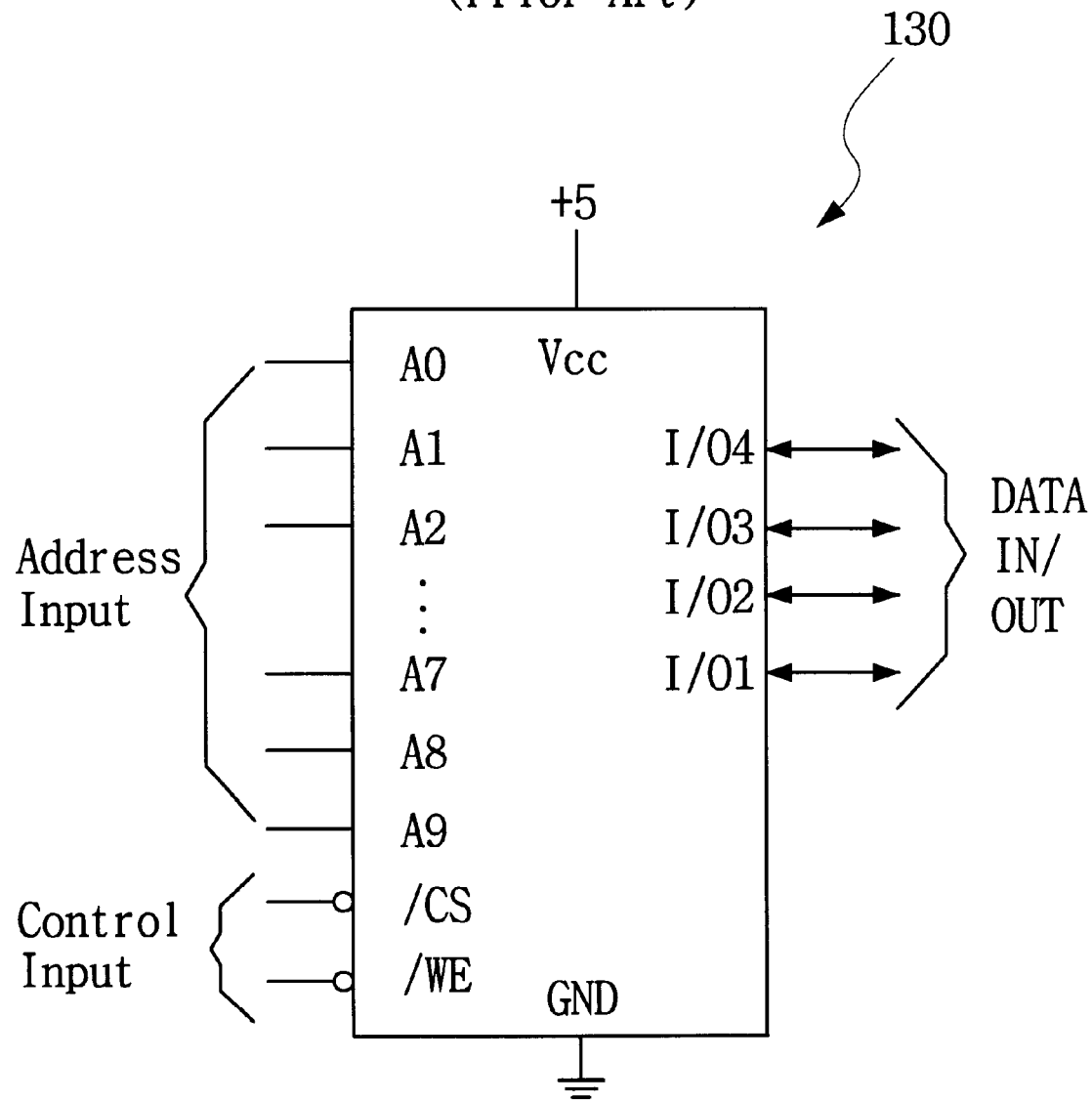
FIG. 2 is a schematic logic diagram of the semiconductor chip package shown in FIG. 1.
Figure 3:
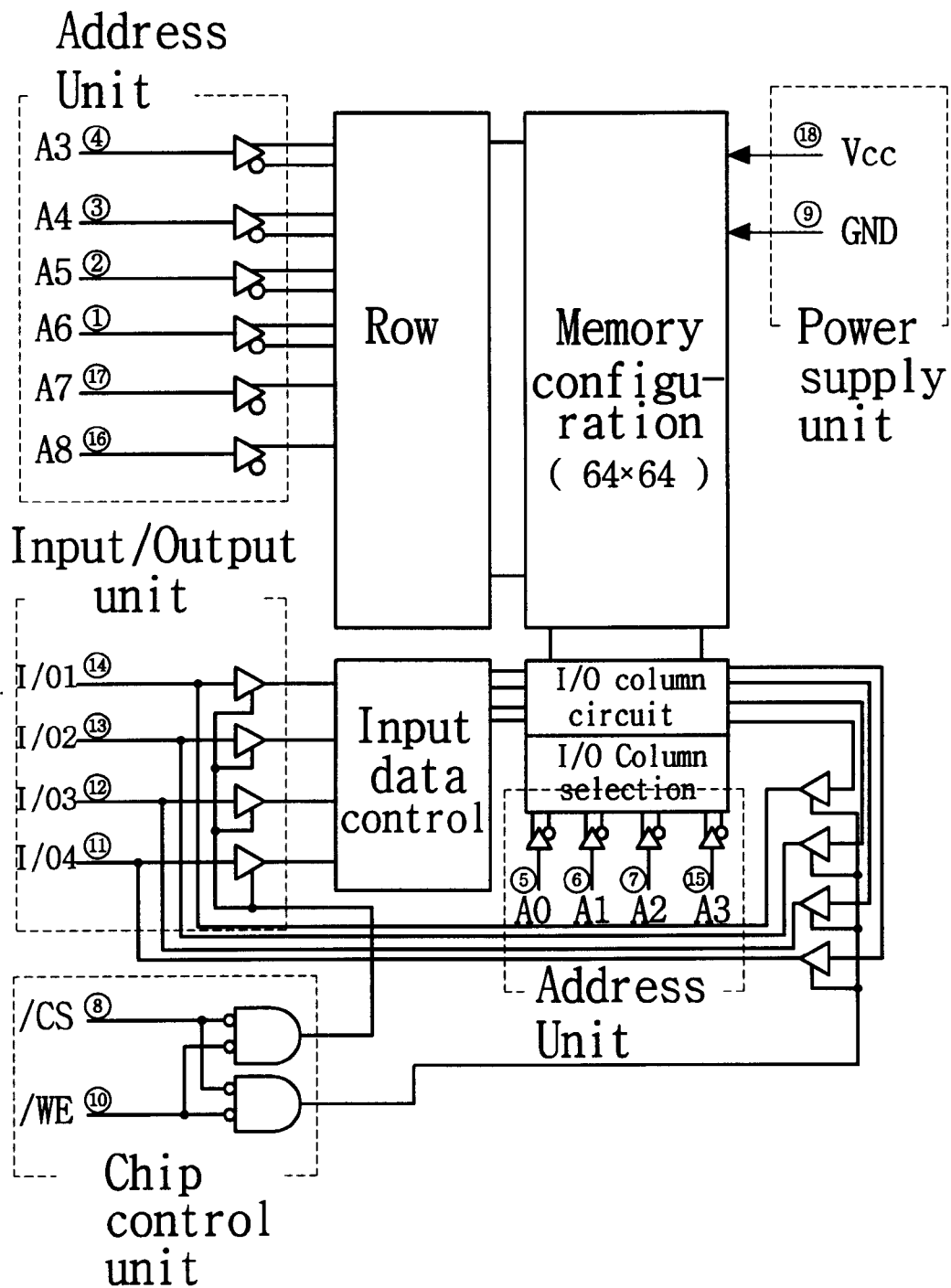
FIG. 3 is a functional block diagram of the semiconductor chip package shown in FIG. 1.
Figure 4:
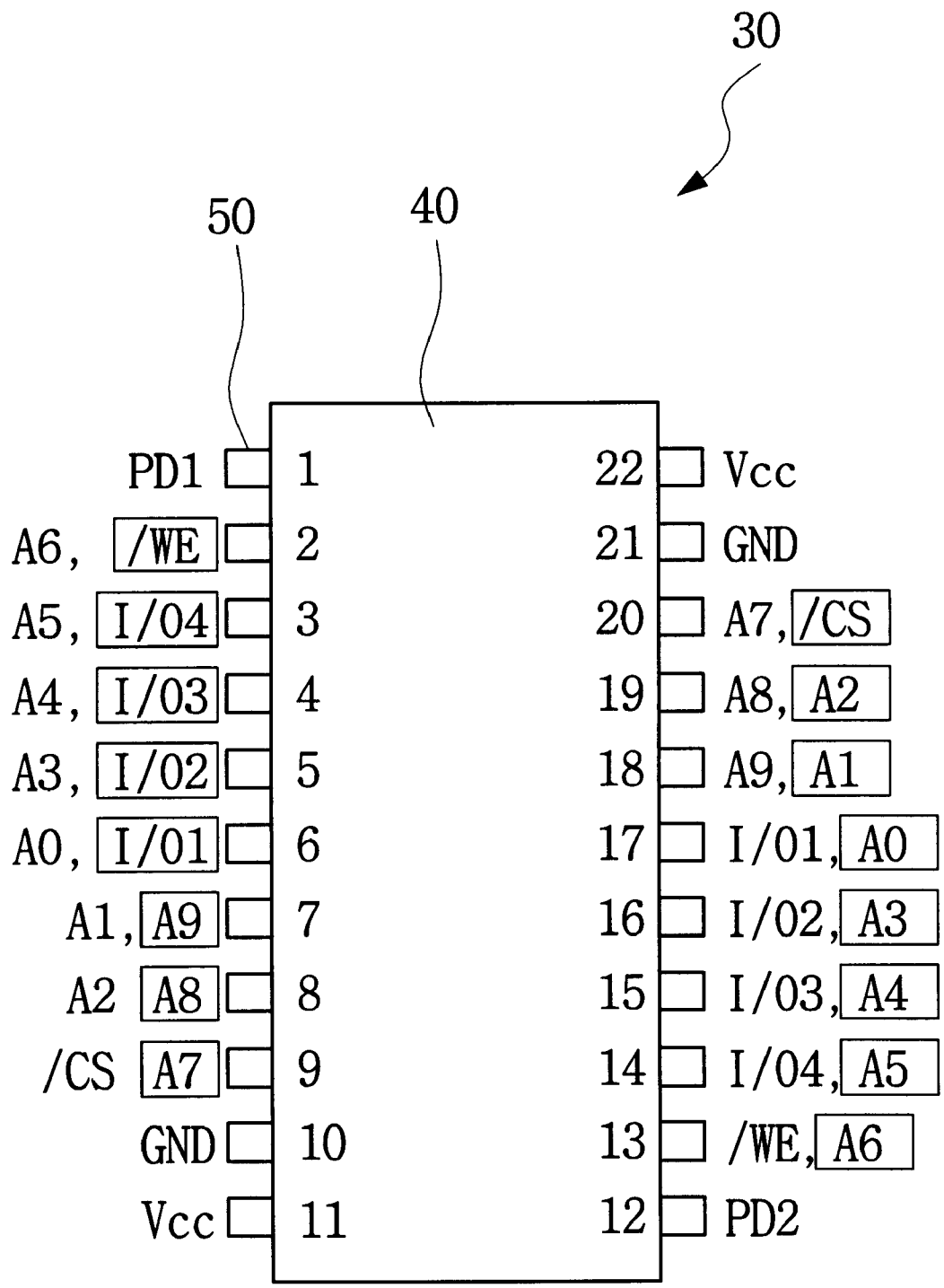
FIG. 4 illustrates a pin configuration of a semiconductor chip package in accordance with one embodiment of the present invention.

FIG. 4 illustrates a pin configuration of a semiconductor chip package in accordance with one embodiment of the present invention. FIG. 5 is a table showing a pin function of the semiconductor chip package shown in FIG. 4.

Referring to FIGS. 4 and 5, a semiconductor chip package 30 of this embodiment is a memory device having the same capacity as the above-described conventional semiconductor chip package. But, unlike the conventional package having eighteen leads, the package of this embodiment has twenty-two leads 50. The added leads are a first pin-definition pin (PD1), a second pin-definition pin (PD2), another power supply pin (VCC) and another ground pin (GND).

The semiconductor chip-package 30 has a package body 40 having a rectangular shape. Leads 50 are arranged along the two longer sides of the package body 40. That is, the semiconductor chip package 30 is a DIP type. Among the leads 50, the first lead is located at the outermost side of one row and may be a first pin-definition pin (PD1). The twelfth lead is rotation-symmetrical to the first lead and may be a second pin-definition pin (PD2). The eleventh lead may be a power supply pin (VCC). The twenty second lead is rotation-symmetrical to the eleventh lead and may be also a power supply pin (VCC). The tenth lead is a ground pin (GND). The twenty first lead is rotation-symmetrical to the tenth lead and may be also a ground pin (GND).

The Second to ninth leads and thirteenth to twentieth leads have unfixed functions. These leads have pin functions that depend on whether power is supplied to the first or second pin-definition pins (PD1, PD2). Specifically, the second lead may be either a sixth address pin (A6) or a write enable pin (/WE). The third lead may be either a fifth address pin (A5) or a first input/output pin (I/01). The seventh lead may either a first address pin (A1) or a ninth address pin (A9). The eighth lead may be either a second address pin (A2) or an eighth address pin (A8). The ninth lead may be either a chip select pin (/CS) or a seventh address pin (A7). The thirteenth lead may be either a sixth address pin (A6) or the write enable pin (/WE). And, the second lead may be either the sixth address pin (A6) or the write enable pin (/WE). If the thirteenth lead functions as the write enable pin (/WE), then the second lead functions as the sixth address pin A6, and vice versa. Likewise, the fourteenth lead and the third lead share the same pin functions, so do the fifteenth lead and the fourth lead, the sixteenth lead and the fifth lead, the seventeenth lead and the sixth lead, the eighteenth lead and the seventh lead, the nineteenth lead and the eighth lead and the twentieth lead and the ninth lead. When one of the lead pairs selects the pin function, the other has corresponding pin function which is rotationally-symmetric to the selected pin.

It will be described in detail how the pin function of a specific lead is switched in the semiconductor chip package 30 of the above-described embodiment.

Figure 6:
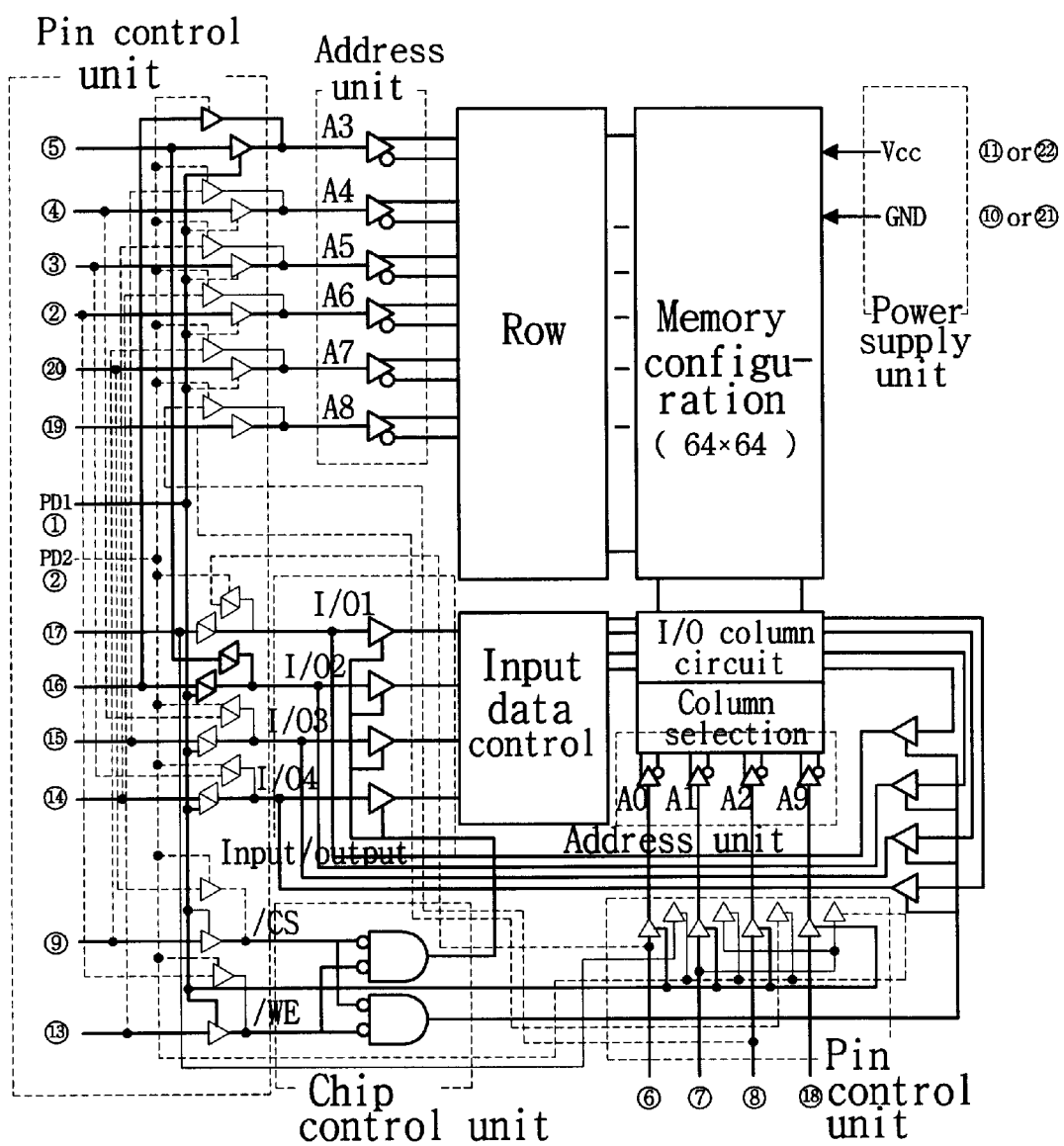
FIG. 6 is a functional block diagram of the semiconductor chip package shown in FIG. 4.
Figure 7:
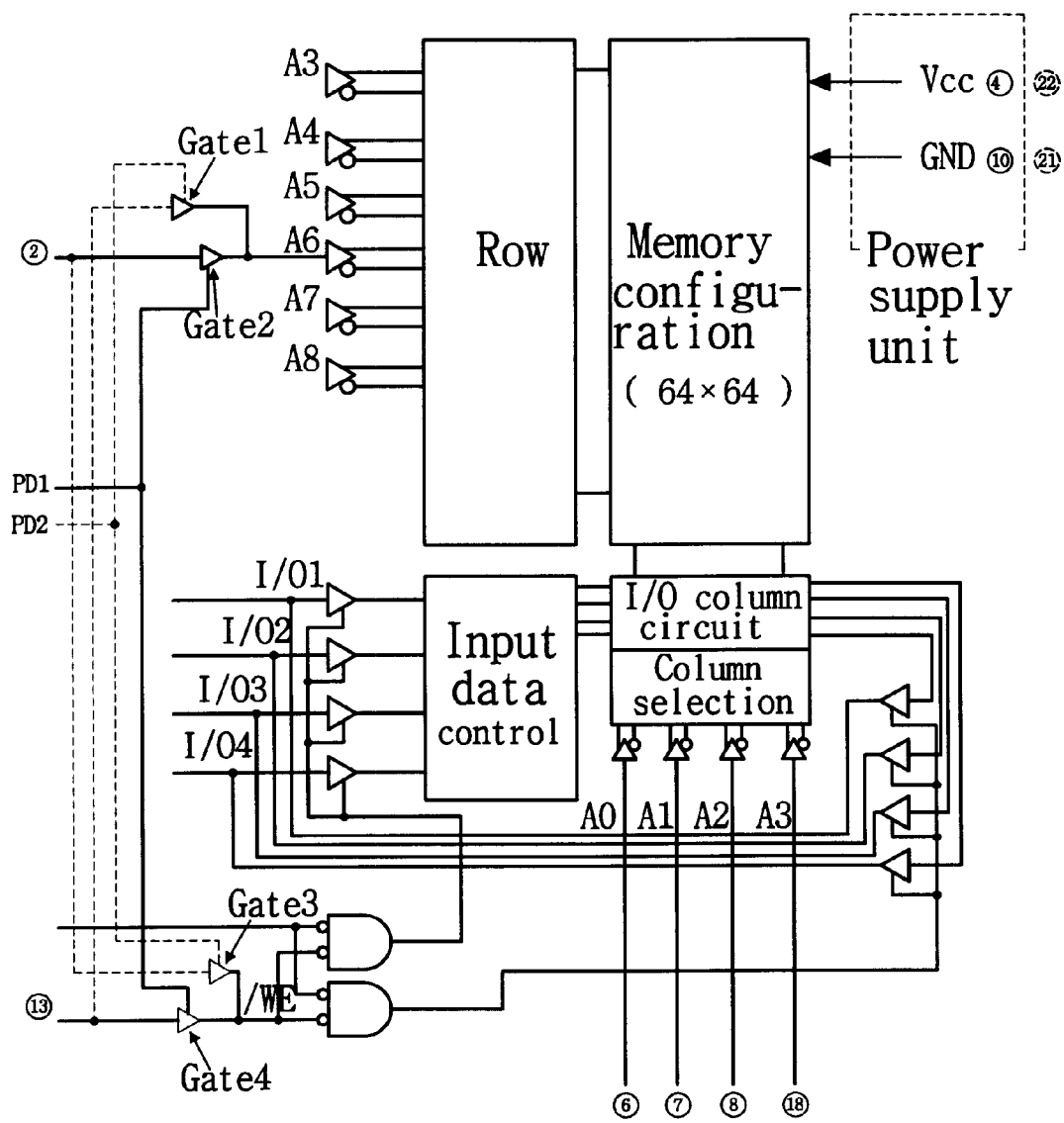
FIG. 7 is a functional block diagram based on a second lead of the semiconductor chip package shown in FIG. 4.
Figure 8:
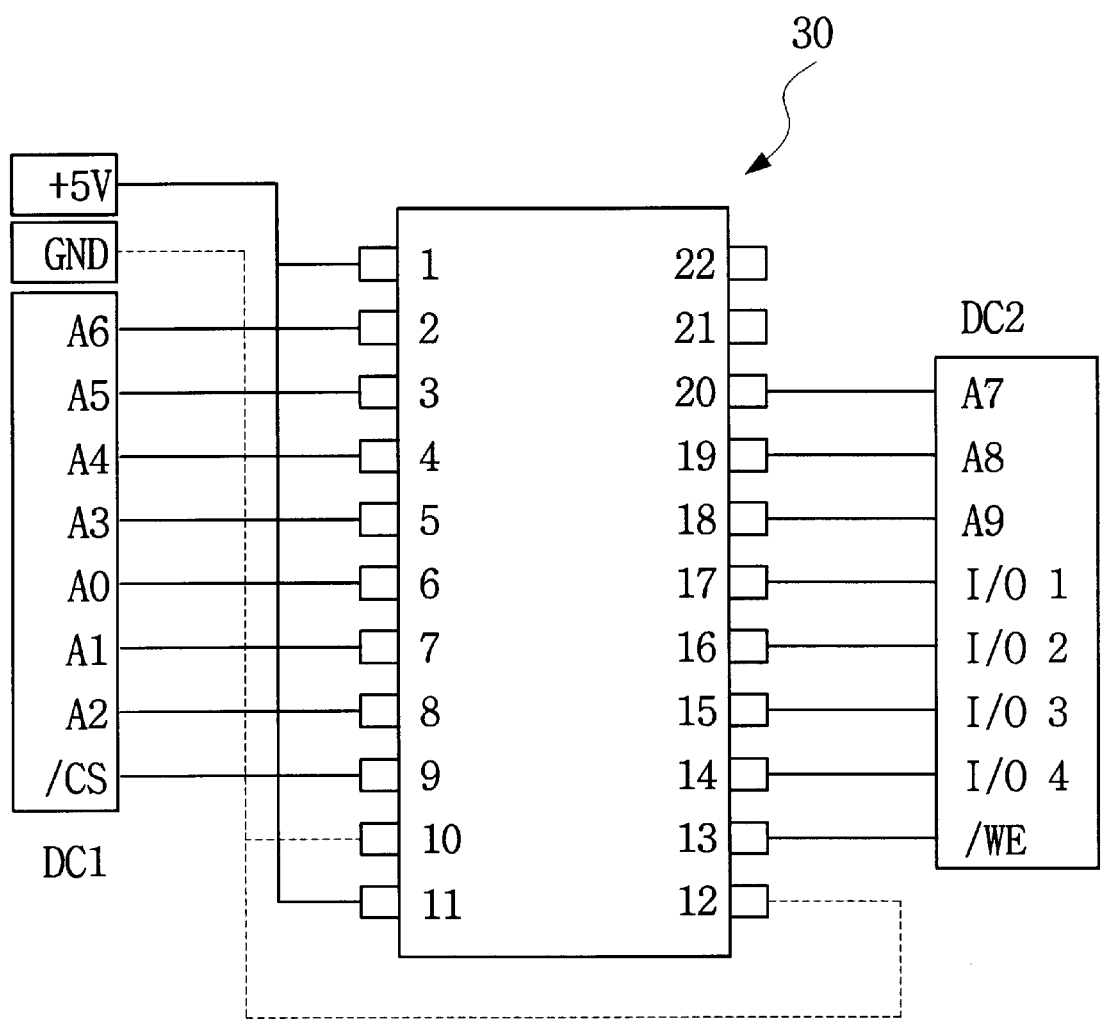
FIG. 8 illustrates a pin connection when the semiconductor chip package shown in FIG. 4 is mounted in a normal direction.
Figure 10:
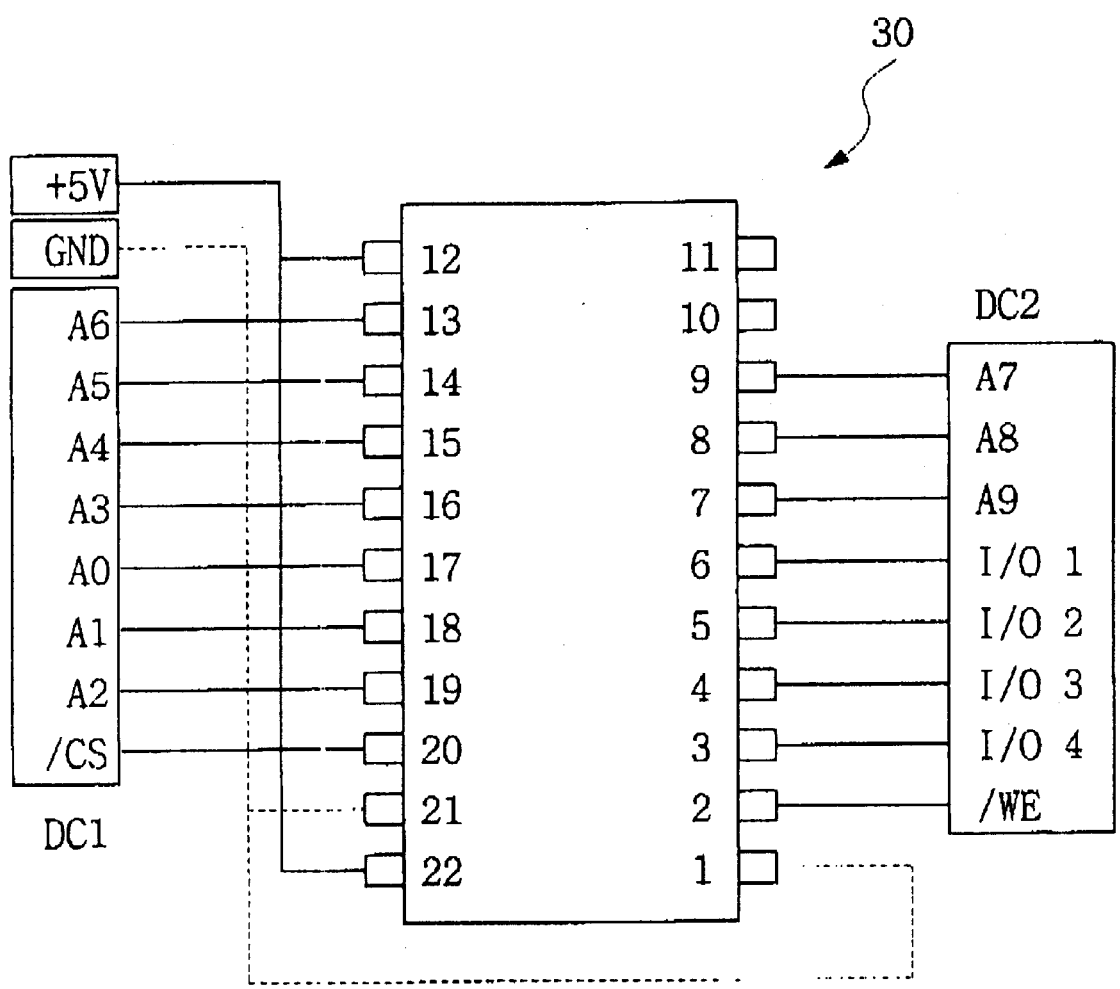
FIG. 10 illustrates a pin connection when the semiconductor chip package shown in FIG. 4 is mounted in opposite direction.

FIG. 6 is a functional block diagram of the semiconductor chip package shown in FIG. 4. FIG. 7 is a functional block diagram based on a second lead of the semiconductor chip package shown in FIG. 4. FIG. 8 illustrates a pin connection when the semiconductor chip package shown in FIG. 4 is mounted in a normal direction. FIG. 9 is a table showing the pin function when the semiconductor chip package 30 shown in FIG. 4 is mounted in a normal direction. FIG. 10 illustrates a pin connection when the semiconductor chip package shown in FIG. 4 is mounted in the opposite direction. Finally, FIG. 11 is a table showing the pin function when the semiconductor chip package shown in FIG. 4 is mounted in the opposite direction.

Referring to FIG. 6, the semiconductor chip package 30 shown in FIG. 4 comprises an address unit including A0, A1, A2 and A9 for selecting rows and A3 to A8 for selecting columns, an input/output unit of I/01 to I/04 for data input and output, a chip control unit comprising a chip select pin (/CS) and write enable pin (/WE), a power supply unit of power supply pins (VCCs) and ground pins (GNDs), and a pin control unit including a switching circuit for selecting the pin function depending on whether power is supplied to the first pin-definition pin (PD1) or the second pin-definition pin (PD2).

Referring to FIG. 7, the switching circuit will be described by giving the sixth address pin (A6) and the write enable pin (/WE) examples. A second gate (gate 2) is formed at the input of the sixth address pin (A6). A fourth gate (gate 4) is formed at the input of the write enable pin (/WE). The control inputs of the second gate (gate 2) and the fourth gate (gate 4) are connected to the first pin-definition pin (PD1). The input of the fourth gate (gate 4) is connected to the output of the second gate (gate 2) at the input of the write enable pin (/WE) and a first gate (gate 1) is formed on the connection line thereof. The input of gate 2 is connected to the output of the fourth gate (gate 4) at the input of the sixth address pin (A6) and a third gate (gate 3) is formed on the connection line thereof. The control inputs of the first gate (gate 1) and the third gate (gate 3) are connected to the second pin-definition pin (PD2).

When power is supplied to the first pin-definition pin (PD1), the second lead is connected to the sixth address pin (A6) via the second gate (gate 2) and the thirteenth lead is connected to the write enable pin (/WE) via the fourth gate (gate 4). When power is supplied to the second pin-definition pin (PD2), a signal is not fed via the second gate (gate 2) and the fourth gate (gate 4). The second lead is instead connected to the write enable pin (/WE) via the third gate (gate 3), and the thirteenth lead is connected to the sixth address pin (A6) via the first gate (gate 1). The other lead pairs are connected in a similar fashion.

The description will be continued based on the second lead and the thirteenth lead when the semiconductor chip package 30 is mounted in a normal direction and in the opposite direction, provided that a printed circuit board is applicable in the case where the second lead is the sixth address pin (A6) and the thirteenth lead is the write enable pin (/WE).

Referring to FIGS. 7 to 9, when the semiconductor chip package 30 is mounted in a normal direction, the first and eleventh leads are connected to the power supply pin (VCC, +5V) of the substrate and the tenth lead and the twelfth lead are connected to the ground pin (GND). The power is supplied to the first lead or the first pin-definition pin (PD1) so that the first lead receives an H signal. The power is supplied to the twelfth lead or the second pin-definition pin (PD2) so that the twelfth lead receives an L signal. The second and fourth gates (gate 2, gate 4), therefore, receive the H signal and are connected to each other. The first and third gates (gate 1, gate 3) receive the L signal and are isolated each other. The sixth address pin (A6) is connected to the second lead and the write enable pin (/WE) is connected to the thirteenth lead. The other leads are connected as shown in FIG. 9. The twenty-first lead and the twenty-second lead have no connections (NCs).

Referring to FIGS. 7, 10 and 11, when the semiconductor chip package 30 is mounted in the opposite direction, the circuit of the substrate remains unchanged. The first lead is connected to the ground pin (GND) of the substrate. The twentieth lead and the twenty second lead are connected to the power supply pin (VCC). Any of the first lead or the first pin-definition pin (PD1) and any of the twelfth lead or the second pin-definition pin (PD2) receive the L and H signals, respectively. The second and fourth gates (gate 2, gate 4) are, therefore, isolated from each other and the first and third gates (gate 1, gate 3) are connected to each other. In the same way, signals from the second and thirteenth leads are fed into the write enable pin (/WE) and the sixth address pin (A6), respectively. The tenth and eleventh leads are NCs.

Accordingly, even if the package is turned 180 degrees, a specific lead can be connected by the switching circuit according to the first pin-definition pin (PD1) and second pin-definition pin (PD2). The eleventh lead and the twenty second lead are all the power supply pins (VCCs). The tenth lead and the twenty-first lead are all the ground pins (GNDs). The leads are connected to the substrate regardless of the mounting direction of the package and power is supplied to the package.

Figure 12:
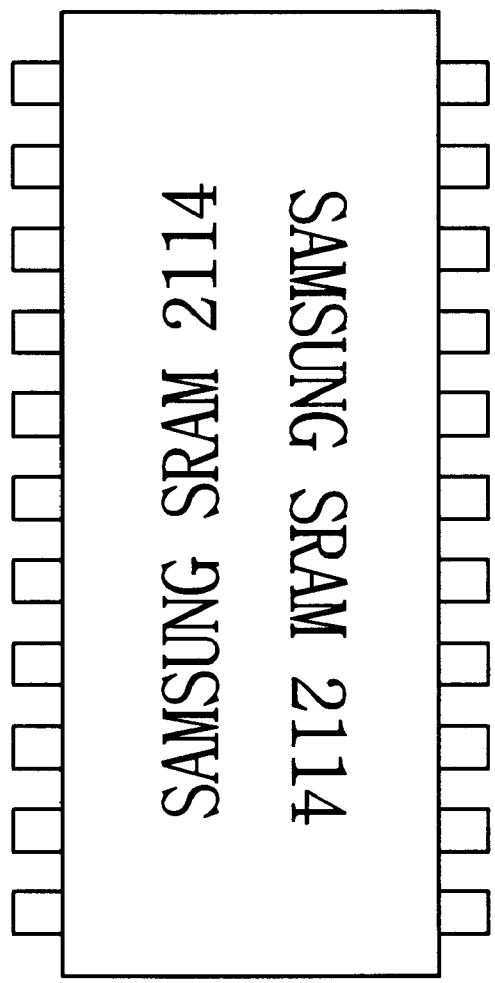
FIG. 12 illustrates one exemplary semiconductor chip package bearing a product code in accordance with the present invention.

FIG. 12 illustrates one exemplary semiconductor chip package bearing a product code in accordance with the present invention.

As shown in FIG. 12, in order to indicate the package has direction-flexible mountability, the semiconductor chip package of the present invention bears a two-line product code which is rotation-symmetrical, for example, SAMSUNG SRAM 2114. The users can, therefore, identify the package as having direction-flexible mountability from the product code.

The semiconductor chip package in accordance with the preferred embodiment of the present invention does not require an indexing process because the package can always operate normally regardless of the mounting direction of package. Accordingly, the present invention eliminates the conventional ID pin indication, the resultant test process and circuit, the ID pin test process, and prevents malfunctioning due to the mounting direction of the package.

Although the preferred embodiments of the present invention uses the DIP (Dual Inline Package) having the leads arranged along the two sides thereof, the present invention is applicable to various types of semiconductor chip packages, for example, QFP (Quad Flat Package) wherein the leads are arranged along the four side of the package, SIP (Single Inline Package) and BGA (Ball Grid Array) wherein external connection terminals are arranged on an entire whole surface in a matrix arrangement.

Although the preferred embodiments of the present invention have been described in detail above, it should be understood that many variations and/or modifications of the basic inventive concepts herein taught will be apparent to those skilled in the art, but will still fall within the spirit and scope of the present invention as defined in the appended claims.

What is claimed is:

1. A semiconductor chip package with direction-flexible mountability comprising:
   a switching circuit that switches a pin function according to a mounting direction of the package;
   a pair of pin definition leads for defining the pin function; and
   a pair of power supply leads and a pair of ground leads, one of which is rotation-symmetrical to the other, respectively.

2. The package of claim 1, wherein the pin definition leads face with the power supply leads and the ground leads, respectively.

3. The package of claim 1, wherein the power supply leads and the ground leads are arranged at the outermost side of rows.

4. The package of claim 1, wherein one of the power supply lead pair, the ground lead pair and the pin definition lead pair is rotation-symmetrical to the other, respectively, as the mounting direction of the package changes 180 degrees.

5. The package of claim 1, wherein one of the power supply lead pair, the ground lead pair and the pin definition lead pair is rotation-symmetrical to the other, respectively, as the mounting direction of the package changes by 90 degree.

6. The package of claim 1, wherein the semiconductor chip package is a DIP (Dual Inline Package).

7. The package of claim 1, wherein the semiconductor chip package is a QFP (Quad Flat Package).

8. The package of claim 1, wherein the semiconductor chip package is a SIP (Single Inline Package).

9. The package of claim 1, wherein the semiconductor chip package is a memory device having address pins, input/output pins, control pins and power supply pins and ground pins.

10. The package of claim 1, wherein the semiconductor chip package bears a plurality of product codes by the mounting directions.

11. A semiconductor chip package comprising a semiconductor chip having an integrated circuit and a plurality of leads which are arranged along the confronting two sides thereof, wherein the semiconductor chip includes a switching circuit for switching a pin function according to the mounting direction of the package, a pair of pin definition leads for defining the pin function and a pair of power supply leads and a pair of ground leads, one of which is rotation-symmetrical to the other, respectively.

12. The package of claim 11, wherein the semiconductor chip package bears a two-row product code which is rotation-symmetrical.

13. A semiconductor chip package comprising:
   a plurality of leads arranged in a plurality of rows, wherein each row contains at least one pin definition lead, at least one power supply lead, at least one ground lead, and a plurality of pin function leads; wherein every lead and at least one other lead of the same type but belonging to a different row are arranged such that they lie at a same radial distance from a central axis perpendicular to a plane containing the plurality of rows; and
   a switching circuit that changes the functionality of the pin function leads depending on which pin definition lead is selected.

14. The package of claim 13, wherein the number of different functions that the switching circuit can assign to each pin function lead is at the most equal to the number of rows in the plurality of rows.

15. The package of claim 13, wherein the power supply leads and the ground leads are located at the outermost ends of the plurality of rows.

16. The package of claim 13, wherein the package is a dual inline package.

17. The package of claim 13, wherein the package is a single inline package.

18. The package of claim 13, wherein the package is a quad flat package.

19. The package of claim 13, wherein the package is a ball grid array.

20. The package of claim 13, wherein the package is a memory device having address pins, input/output pins, control pins, power supply pins and ground pins.

* * * * *

UNITED STATES PATENT AND TRADEMARK OFFICE
CERTIFICATE OF CORRECTION

| | |
|---|---|
| PATENT NO. | : 6,653,727 B2 |
| DATED | : November 25, 2003 |
| INVENTOR(S) | : Hwang et al. |

It is certified that error appears in the above-identified patent and that said Letters Patent is hereby corrected as shown below:

<u>Column 1,</u>
Line 39, "chip. select" should read -- chip select --.
Line 42, "pins (I/04 to I/01)," should read -- pins (I/O4 to I/O1), --.

<u>Column 3,</u>
Line 30, "chip-package 30" should read -- chip package 30 --.
Line 49, "pin (I/01)." should read -- pin (I/O1). --.

<u>Column 4,</u>
Line 20, "of I/01 to I/04 for" should read -- of I/O1 to I/O4 for --.

Signed and Sealed this

Sixth Day of July, 2004

JON W. DUDAS
*Acting Director of the United States Patent and Trademark Office*